United States Patent
Kaindl et al.

(10) Patent No.: US 6,552,545 B2
(45) Date of Patent: Apr. 22, 2003

(54) GRADIENT COIL WITH DIRECT COOLING

(75) Inventors: Arthur Kaindl, Erlangen (DE); Lothar Schoen, Neunkirchen (DE); Johann Schuster, Oberasbach (DE)

(73) Assignee: Siemens Aktiengesellschaft, Munich (DE)

( * ) Notice: Subject to any disclaimer, the term of this patent is extended or adjusted under 35 U.S.C. 154(b) by 33 days.

(21) Appl. No.: 09/833,909

(22) Filed: Apr. 12, 2001

(65) Prior Publication Data

US 2001/0042385 A1 Nov. 22, 2001

(30) Foreign Application Priority Data

Apr. 12, 2000 (DE) .......................................... 100 18 165

(51) Int. Cl.⁷ ................................................. G01V 3/00
(52) U.S. Cl. ...................................................... 324/318
(58) Field of Search ................................. 324/318, 322, 324/307, 309

(56) References Cited

U.S. PATENT DOCUMENTS

| | | | | |
|---|---|---|---|---|
| 4,780,676 A | * | 10/1988 | Muller et al. ................ | 165/267 |
| 5,570,021 A | * | 10/1996 | Dachniwskyj et al. ...... | 324/318 |
| 6,011,394 A | * | 1/2000 | Petropoulos et al. ........ | 324/318 |
| 6,075,363 A | * | 6/2000 | Sellers et al. ................ | 324/318 |
| 6,111,412 A | | 8/2000 | Boemmel et al. | |
| 6,208,141 B1 | * | 3/2001 | Amor et al. ................. | 324/307 |
| 6,236,207 B1 | * | 5/2001 | Arz et al. .................... | 324/318 |

* cited by examiner

*Primary Examiner*—Edward Lefkowitz
*Assistant Examiner*—Dixomara Vargas
(74) *Attorney, Agent, or Firm*—Schiff Hardin & Waite

(57) ABSTRACT

Gradient coil for magnetic resonance (MR) devices has direct cooling by means of cooling lines that are embedded in the coil and through which a cooling agent flows. The cooling lines are arranged substantially parallel to one another, such as parallel to the axis of the gradient coil, and are combined to form heat exchanger modules whose individual cooling lines are coupled with one another so that the maximum length between the inlet and outlet of a module corresponds to twice the longitudinal length of the gradient coil.

10 Claims, 1 Drawing Sheet

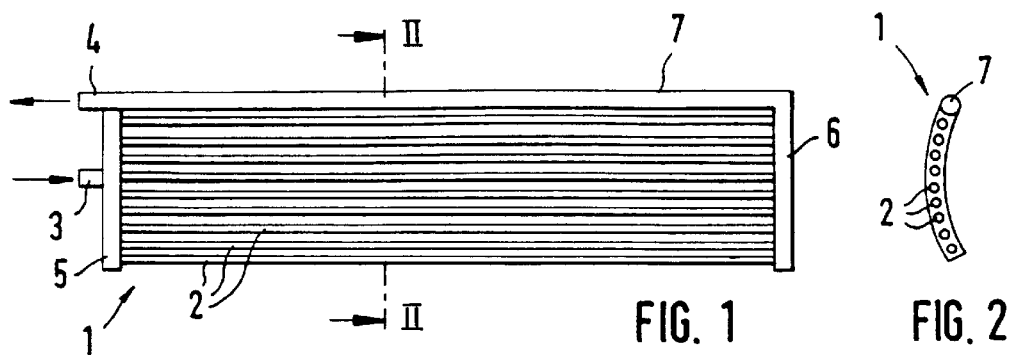
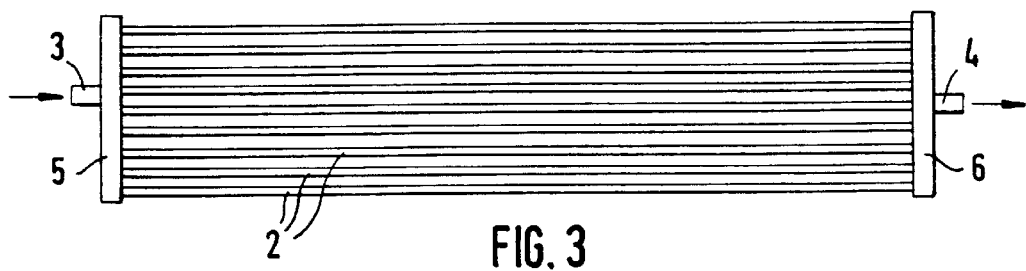
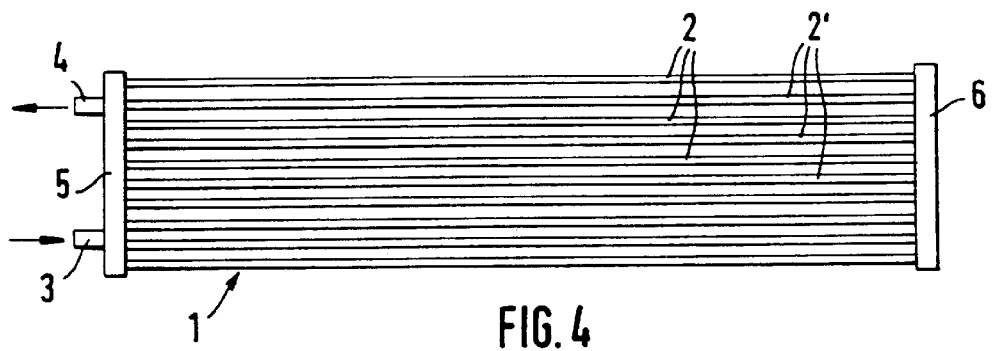
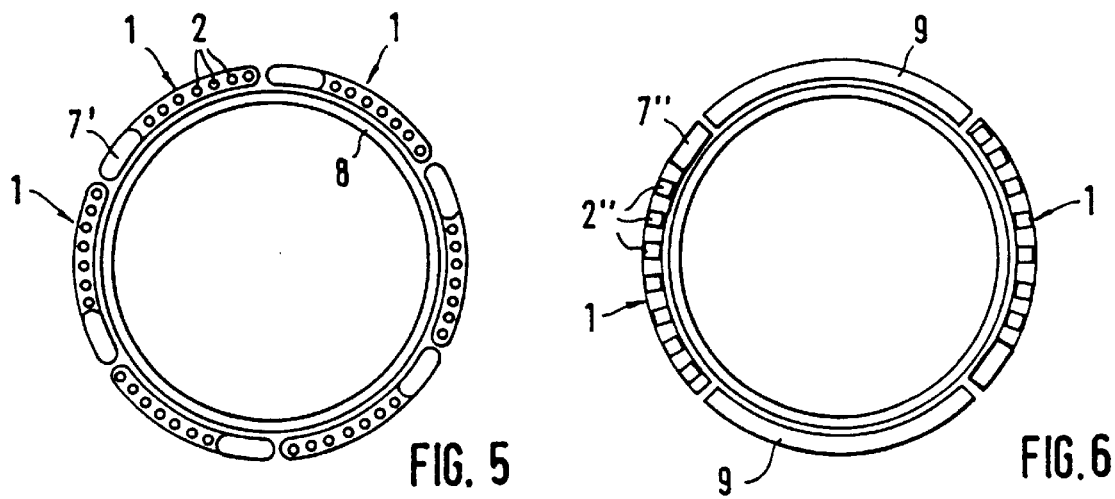

GRADIENT COIL WITH DIRECT COOLING

BACKGROUND OF THE INVENTION

1. Field of the Invention

The present invention relates to a gradient coil for MR devices, of the type having direct cooling by means of cooling lines that are embedded in the coil and through which a cooling agent flows.

2. Description of the Prior Art

In gradient coils for MR systems, significant heat arises due to the high electrical losses. This heat must be effectively dissipated by active cooling. Essential reasons for this dissipation of temperature include avoidance of an impermissible stress on the patient due to high temperature, as well as avoiding heating of the casting resin molding material used in the gradient coil system above its glass transition temperature. If the casting resin molding material is heated above its glass transition temperature, there will result drastic changes in the mechanical characteristics, as well as a possible formation of cracks in the molding material, or a dissolution of boundary surfaces and a resulting reduction of the TE starting voltage. The situation is made more critical by increasingly large differences in the thermal expansion of the materials used (copper, glass-fiber-reinforced plastic, casting resin) at higher temperatures. The maximum permissible temperature thereby represents an undesired limitation in the efficiency design.

Besides the possibility of cooling by providing hollow electrical lines, through which a cooling agent flows, as the coil windings, there is the possibility of dissipating the heat loss via two layers of two tightly wound cooling conduits made of metal or polyamide. Besides the less-than-optimal cooling due to the often poor heat conductivity of the conduit material used (temperature jump at the conduit wall), in the arrangements most often used—which include, among others, structures wound in spiral fashion—long conduit lengths of approximately 50 meters result between the inlet and outlet. This results in a high loss of pressure in the lines, which, given cast-in connecting parts, can lead to leakages. Due to the sealed structure of the gradient coil system, leaking sections can be removed only with great difficulty or not at all, which is disadvantageous.

SUMMARY OF THE INVENTION

An object of the present invention is to provide an arrangement directly cooling a gradient coil that operates effectively with a simple design, while avoiding long cooling line lengths, and thereby enables a highly efficient construction of the gradient coil.

This object is inventively achieved in an arrangement wherein the cooling lines are disposed substantially parallel to one another, preferably running parallel to the axis of the gradient coil, and are combined to form heat exchanger modules whose individual cooling lines are coupled with one another so that the maximum length between the inlet and outlet of a module corresponds to twice the longitudinal length of the gradient coil.

By virtue of the inventive design in which the tube length through which coolant flows amounts only to a maximum of twice the coil longitudinal length, small pressure losses result, which also allows a lower inlet pressure to be used. This in turn also allows, among other things, a more advantageous design with thinner wall thicknesses, and thus with reduced heat resistance, so that the absorption of the heat from the surrounding heated areas of the gradient coil is improved. Due to the arrangement of the cooling lines in groups running parallel to one another, forming a module having an inlet and an outlet, the time-consuming winding of the cooling coil layers, is required in some known gradient coils, is also avoided.

The cooling lines of a module can be coupled at one end to a common cooling agent inlet and at the other end to a common cooling agent outlet. In an embodiment of this version the cooling agent inlet and/or the cooling agent outlet can terminate centrally into distribution channels whose cross-section is larger than that of the cooling lines. The inlet and the outlet are then located in alternating fashion at different end surfaces (coil ends) of the gradient coil, which can cause difficulties given the current manufacture of such gradient coils. This is because these coils, after being wound to the desired design are conventionally flooded with casting resin in a form from bottom to top, so that one frontal surface is sealed, and thus a cooling agent inlet or outlet leading the exterior can be arranged there only with difficulty.

In order to avoid these difficulties, in a further embodiment of the invention the cooling agent return is led back via a return line substantially parallel to the cooling lines, to the feed-in end surface of the gradient coil having the cooling agent inlet, and the return line has an expanded cross-section in relation to the primary cooling lines. Preferably, the return line has substantially oval or rectangular cross-section whose with a radial dimension corresponding to the radial dimension of the cooling agent lines, so that a module of cooling lines including such a return line has a uniform thickness. This allows the module to be disposed, for example, between successive winding layers of a gradient coil, particularly as a cylinder segment in the intermediate space between the windings of a gradient coil.

Alternatively, a portion of the cooling lines of a module, preferably exactly one-half of the cooling lines of a module, can be coupled with one another, at the side downstream from the inlet as return lines. In contrast to the two aforementioned exemplary embodiments, in which the cooling lines are each only as long as the longitudinal length of the gradient coil, in this embodiment effective cooling line lengths result that can be as much as twice the coil longitudinal length.

DESCRIPTION OF THE DRAWINGS

FIG. 1 is a plan view of an inventive heat exchanger module.

FIG. 2 shows a section along the line II—II in FIG. 1.

FIG. 3 shows a view of a second embodiment of an inventive heat exchanger module having inlet and outlet at opposite end surfaces.

FIG. 4 shows a view of a symmetrical heat exchanger module in which some of the lines are fashioned as primary cooling lines and some as return lines.

FIG. 5 is a section through a part of a gradient coil having inventive heat exchanger modules, with a return line having an enlarged cross-section.

FIG. 6 shows a section, corresponding to FIG. 5, through a further embodiment of a gradient coil having inventive heat exchanger modules.

DESCRIPTION OF THE PREFERRED EMBODIMENTS

For the effective direct cooling of gradient coils, heat exchanger modules 1, fashioned generally as cylinder segments, are provided that are composed of a number of cooling lines 2 that run parallel to one another. The cooling lines 2, which are coupled with one another as a whole or in groups at one end surface, and at the other end surface, so that a maximum length corresponding to twice the coil longitudinal length results between the inlet 3 and outlet 4 of a module 1.

In the exemplary embodiment according to FIG. 1, the cooling lines 2 at the fluid entry side are connected with one another by a common distribution channel 5, into which the inlet 3 preferably centrally discharges. In the same way, the cooling lines 2 are connected with one another at the opposite side by a distribution channel 6 that returns the collected cooling water to the outlet 4 via a return line 7 at the same end surface as the inlet 3. The cross-sections of the distribution channels 5 and 6 and of the return line 7 are larger than the cross-section of the cooling lines 2, in order not to lose the advantage of the small cooling line lengths, and thereby the small pressure drop in the return line 7, which must accommodate a correspondingly larger flow. The cooling lines 2 can be flexible conduits or metal tubes, for example copper tubes. The cooling lines with their distribution channels 5, 6 and the return line 7 form a module that can be inserted as a pre-manufactured component into a gradient coil unit that is being constructed. For example, such modules 1, as shown in FIG. 5, can be attached as a covering or overlap for a coil layer 8, and an additional layer of gradient coil windings can be arranged around this heat exchanger module, etc.

In this context, it is clear that the inlet and outlet can be exchanged, in position i.e., the outlet could be arranged at 3 and the inlet could be arranged at 4.

In the exemplary embodiment according to FIG. 3, the cooling lines 2 are again connected with one another by distribution channels 5 and 6 at both end surfaces, with however the inlet 3 arranged at one end surface and the outlet 4 arranged at the other end surface, which in many design forms of gradient coils could cause structure or manufacturing problems.

In the arrangement according to FIG. 4, the inlet 3 and the outlet 4 are again located at the same end surface of the module 1, and are thereby of course also located on the same end surface of the gradient coil into which this module 1 is installed. One-half of the cooling lines 2 serve as primary lines, with only lines in this half of the cooling lines 2 being connected with one another via the distribution channel 5 and to the inlet 3. The other cooling lines 2' are coupled with one another through a sub-distribution channel arranged inside the distribution channel 5 and are connected to the outlet 4. The connection of the cooling lines 2 and 2' with one another takes place through the distribution channel 6 on the right side, so that the cooling agent conducted to the right via the cooling lines 2 is again conducted back to the left via the cooling lines 2' and is transported to the outlet 4.

In the exemplary embodiment according to FIG. 5, the return line 7' has an enlarged cross-section, which is essentially constructed as an oval line whose radial longitudinal length corresponds to the diameter of the normal cooling lines 2. FIG. 6 schematically shows an embodiment of a gradient coil in which inventive heat exchanger modules 1 are installed in the intermediate spaces between the conductor structures 9 of each coil layer. Such an installation of heat exchanger modules 1 can take place in all coil layers or in a number of coil layers. Conventionally, the conductor structures 9 are offset from one another in the various coil layers, and the modules 1 in the circumference are then correspondingly arranged in the individual coil layers so as to be offset in relation to one another. Here as well, it can be seen that the return lines 7", which are rectangular in cross-section, have a considerably larger cross-section than the cooling lines 2".

The aforementioned longitudinal length of the cooling lines 2 (and 2') proceeds perpendicular to the plane of the drawing in each of FIGS. 5 and 6.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient coil arrangement for a magnetic resonance apparatus, comprising:

at least one conductor forming a gradient coil having a longitudinal length; and a heat exchanger module having one inlet and one outlet and a plurality of cooling lines in fluid communication with said inlet and said outlet, with cooling agent flowing into said inlet and through said cooling lines and out of said outlet, said cooling lines proceeding substantially parallel to each other and said inlet and said outlet being disposed relative to each other so that a maximum length through which said cooling agent flows between said inlet and said outlet is twice said longitudinal length of said coil, wherein all of the cooling lines in said module being connected at one end of said module, to a first distribution channel in fluid communication with said inlet for said cooling agent and at an opposite end of said module, to a second distribution channel in fluid communication with said outlet for said cooling agent, and said inlet centrally discharging into said first distribution channel and said second distribution channel discharges centrally into said outlet.

2. A gradient coil arrangement as claimed in claim 1 wherein said gradient coil has a longitudinal axis and wherein said cooling lines proceed parallel to said longitudinal axis of said gradient coil.

3. A gradient coil arrangement as claimed in claim 1 further comprising a return line, proceeding substantially parallel to said cooling lines, in fluid communication with said common outlet and proceeding from said common outlet to said end of said module at which said common inlet is disposed.

4. A gradient coil arrangement as claimed in claim 3 wherein each of said cooling lines has a radio dimension, and wherein said return line has a radio dimension which is larger than the radio dimension of said cooling lines.

5. A gradient coil arrangement as claimed in claim 4 wherein said return line has an oval cross-section.

6. A gradient coil arrangement as claimed in claim 4 wherein said return line has a rectangular cross-section.

7. A gradient coil arrangement as claimed in claim 1 wherein a portion of said cooling lines are in fluid communication with each other at said outlet of said module to form return lines for said cooling agent.

8. A gradient coil arrangement as claimed in claim 6 wherein said portion comprises one-half.

9. A gradient coil arrangement as claimed in claim 1 wherein said heat exchanger module forms a segment of a cylinder.

10. A gradient coil arrangement as claimed in claim 8 wherein said gradient coil forms another segment of said cylinder, and is disposed next to said heat exchanger module on a circumference of said cylinder.

* * * * *